(12) United States Patent
Jing

(10) Patent No.: US 7,265,997 B2
(45) Date of Patent: Sep. 4, 2007

(54) MOUNTING APPARATUS FOR MOUNTING EXPANSION CARDS IN COMPUTER ENCLOSURE

(75) Inventor: Xiao-Zhong Jing, Shenzhen (CN)

(73) Assignees: Hong Fu Jin Precision Industry (Shenzhen) Co., Ltd., Bao-an District, Shenzhen, Quangdong Province (CN); Hon Hai Precision Industry Co., Ltd., Tu-Cheng, Taipei-Hsien (TW)

( * ) Notice: Subject to any disclaimer, the term of this patent is extended or adjusted under 35 U.S.C. 154(b) by 294 days.

(21) Appl. No.: 11/019,820

(22) Filed: Dec. 21, 2004

(65) Prior Publication Data

US 2006/0007664 A1    Jan. 12, 2006

(30) Foreign Application Priority Data

Jun. 7, 2004    (CN)    ......... 2004 2 0047008

(51) Int. Cl.
   H05K 7/12    (2006.01)
(52) U.S. Cl. ............ 361/801; 361/747; 361/759; 361/732; 361/726; 312/223.2
(58) Field of Classification Search ......... 361/801, 361/726, 732, 740, 741, 747, 759, 796; 312/223.2, 312/223.3
See application file for complete search history.

(56) References Cited

U.S. PATENT DOCUMENTS

| | | | |
|---|---|---|---|
| 4,745,524 A | 5/1988 | Patton, III | |
| 5,822,196 A | 10/1998 | Hastings et al. | |
| RE36,695 E | 5/2000 | Holt | |
| 6,069,796 A | 5/2000 | Hastings et al. | |
| 6,215,668 B1 * | 4/2001 | Hass et al. | 361/759 |
| 6,320,760 B1 * | 11/2001 | Flamm et al. | 361/801 |
| 6,480,393 B1 | 11/2002 | Chen | |
| 6,487,070 B2 | 11/2002 | Gan | |
| 6,549,398 B2 * | 4/2003 | Chen | 361/683 |
| 6,552,913 B2 | 4/2003 | Tournadre | |
| 6,608,765 B2 | 8/2003 | Vier et al. | |
| 6,950,313 B1 * | 9/2005 | Shih | 361/759 |
| 6,960,720 B2 * | 11/2005 | Wen-Lung | 174/50 |
| 6,970,363 B2 * | 11/2005 | Bassett et al. | 361/801 |
| 7,050,296 B2 * | 5/2006 | Liao | 361/685 |
| 2004/0037048 A1 | 2/2004 | Liao | |

\* cited by examiner

Primary Examiner—Dean A. Reichard
Assistant Examiner—Dameon E. Levi
(74) Attorney, Agent, or Firm—Morris Manning & Martin LLP; Tim Tingkang Xia, Esq.

(57) ABSTRACT

A mounting apparatus for mounting a plurality of expansion cards (30) with cover plates (35) to a computer enclosure includes a rear panel (14) and a fixing member (40). The cover plate has an elongated portion (37) and a bent portion (39). The rear panel has a card cage (24). The card cage includes a base wall (26) to support the cover plate, and a bent wall (28). The fixing member mounted at an upper portion of the rear panel includes a bracket (42) and a plurality of fasteners (62) movably mounted on the bracket. The bracket forms a plurality of securing portions (50) thereof. The fasteners each include a pressing portion (66) corresponding to the bent portion of the cover plate. The arm portion forms a second securing portion (76) corresponding to the first securing portion.

20 Claims, 4 Drawing Sheets

MOUNTING APPARATUS FOR MOUNTING EXPANSION CARDS IN COMPUTER ENCLOSURE

BACKGROUND OF THE INVENTION

1. Field of the Invention

The present invention relates to a mounting apparatus for mounting expansion cards in a computer enclosure, and particularly to a mounting apparatus which readily secures a plurality of expansion cards in a computer enclosure and allows convenient removal of the expansion cards therefrom.

2. Description of the Related Art

In order to upgrade the operating capabilities of a personal computer, a plurality of expansion cards is operatively installed in the computer enclosure. Typical types of expansion cards include network cards, sound cards, graphics accelerator cards and multi-media cards, etc. These expansion cards may be installed in the computer enclosure during its original manufacture or by the computer purchaser.

U.S. Pat. No. 4,745,524 discloses a plurality of mounting systems for mounting a plurality of expansion cards inside a computer chassis. Each mounting system includes a pressing element and a screw to secure a separate cover plate of corresponding expansion card. However, installing screws one by one is time-consuming and cumbersome. Moreover, during installation/removal of the expansion cards, one or more of the screws can easily fall into the crowded interior of the computer, thereby creating a difficult retrieval.

Thus an improved mounting device which overcomes the above-mentioned problems is desired.

SUMMARY OF THE INVENTION

Accordingly, an object of the present invention is to provide a mounting apparatus which readily and securely attaches expansion cards in a computer enclosure.

To achieve the above-mentioned object, a mounting apparatus for mounting a plurality of expansion cards with cover plates to a computer enclosure comprises a rear panel and a fixing member. The cover plate has an elongated portion and a bent portion. The rear panel has a card cage. The card cage comprises a base wall to support the cover plate, and a bent wall. The fixing member mounted at an upper portion of the rear panel comprises a bracket and a plurality of fasteners movably mounted to the bracket. The bracket forms a plurality of securing portions thereof. Each of the fasteners includes a pressing portion corresponding to the bent portion of the cover plate, and at least one arm portion. The at least one arm portion forms a second securing portion corresponding to the first securing portion.

Other objects, advantages and novel features of the present invention will be drawn from the following detailed description of a preferred embodiment of the present invention with attached drawings, in which:

DETAILED DESCRIPTION OF THE INVENTION

Figure 1:
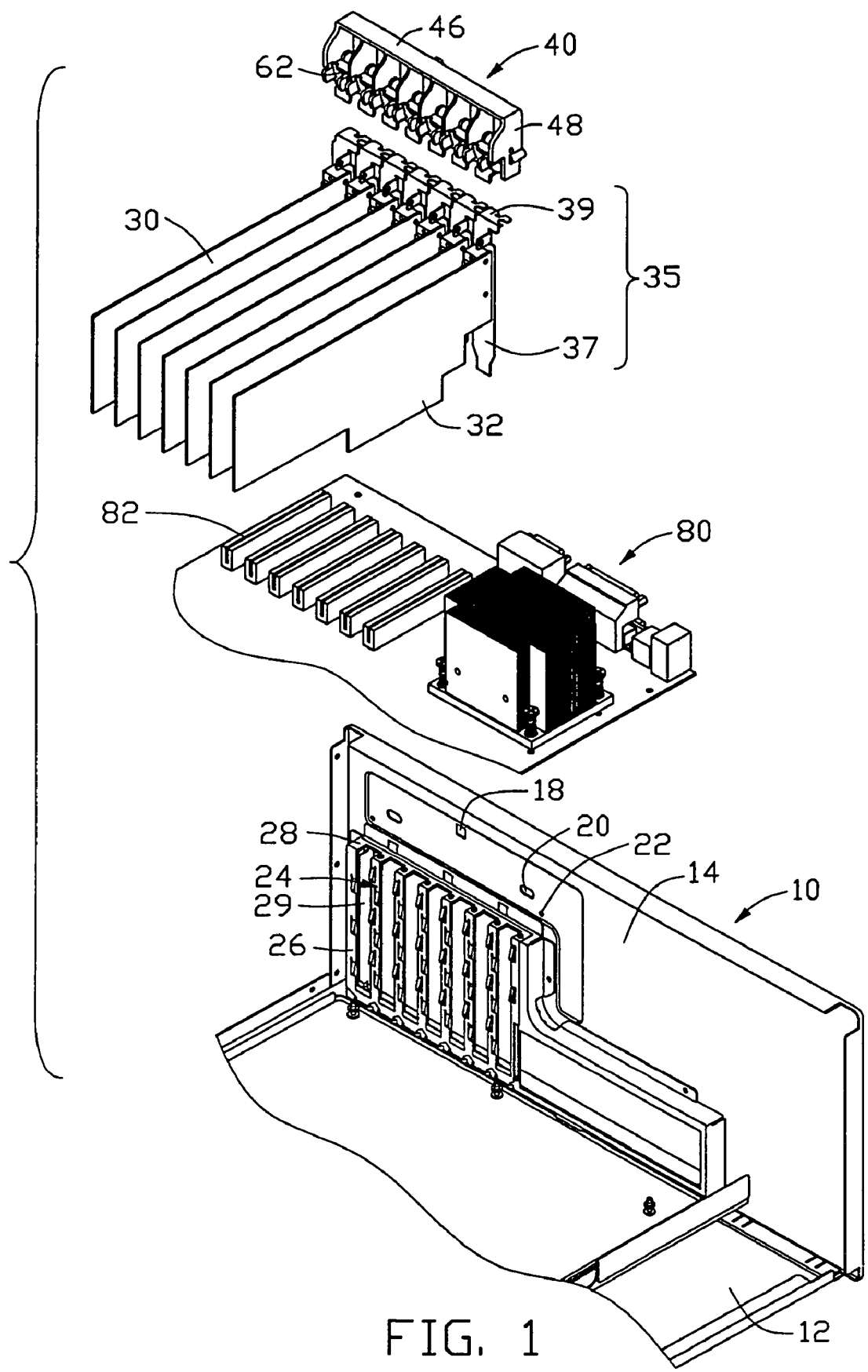
FIG. 1 is an exploded, isometric view of a mounting apparatus in accordance with a preferred embodiment of the present invention, together with a circuit board, a plurality of expansion cards and a plurality of cover plates for expansion cards, the mounting apparatus comprising a chassis and a fixing member.

Referring to FIG. 1, a mounting apparatus in accordance with the preferred embodiment of the present invention is used to fix a plurality of expansion cards 30 with cover plates 35 to an enclosure of an electronic device like a computer. The mounting apparatus comprises a chassis 10 and a fixing member 40. Each cover plate 35 comprises a rectangular elongated portion 37 connected to the expansion card 30, and a bent portion 39 extending perpendicularly from one end of the elongated portion 37. A cutout (not labeled) is defined in the bent portion 39.

The chassis 10 comprises a bottom panel 12 supporting a circuit board 80 and a rear panel 14 extending upwardly from a rear side of the bottom panel 12. A fixing hole 18 is defined in a top portion of the rear panel 14. A pair of positioning holes 20 is defined in the rear panel 14 under the fixing hole 18. A mounting hole 22 is defined under each of the positioning holes 20. The rear panel 14 further comprises an L-shaped card cage 24 at a bottom portion. The card cage 24 comprises a base wall 26 and a bent wall 28 extending perpendicularly from the base wall 26. A plurality of expansion card slots 29 is defined in the base wall 26 parallel to each other, and further extends to the bent wall 28, having a similar profile with the cover plates 35. A plurality of positioning posts (no labeled) is formed on the bent wall 28 corresponding to the cutouts of the cover plates 35.

Figure 2:
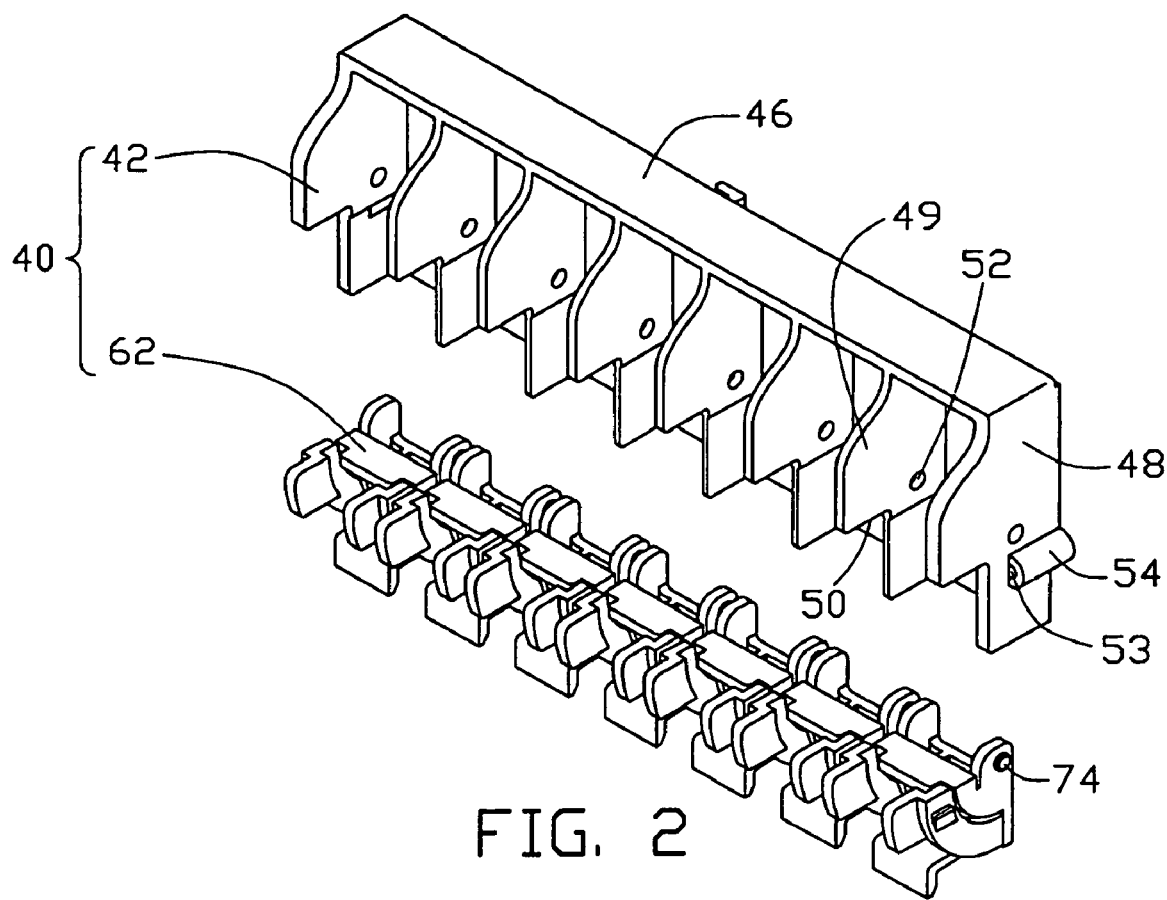
FIG. 2 is an exploded, isometric view of the fixing member of FIG. 1, the fixing member comprising a bracket and a plurality of fasteners.
Figure 3:
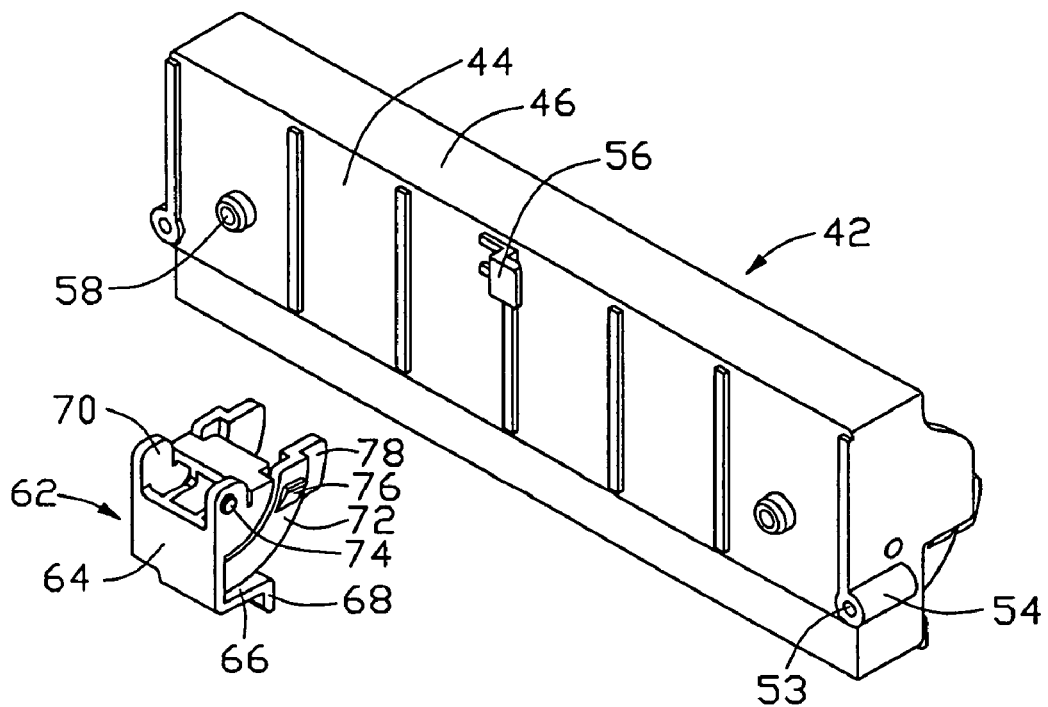
FIG. 3 is an assembled view of the fixing member of FIG. 2, but viewed from another aspect, with one fastener being separate from the bracket.
Figure 4:
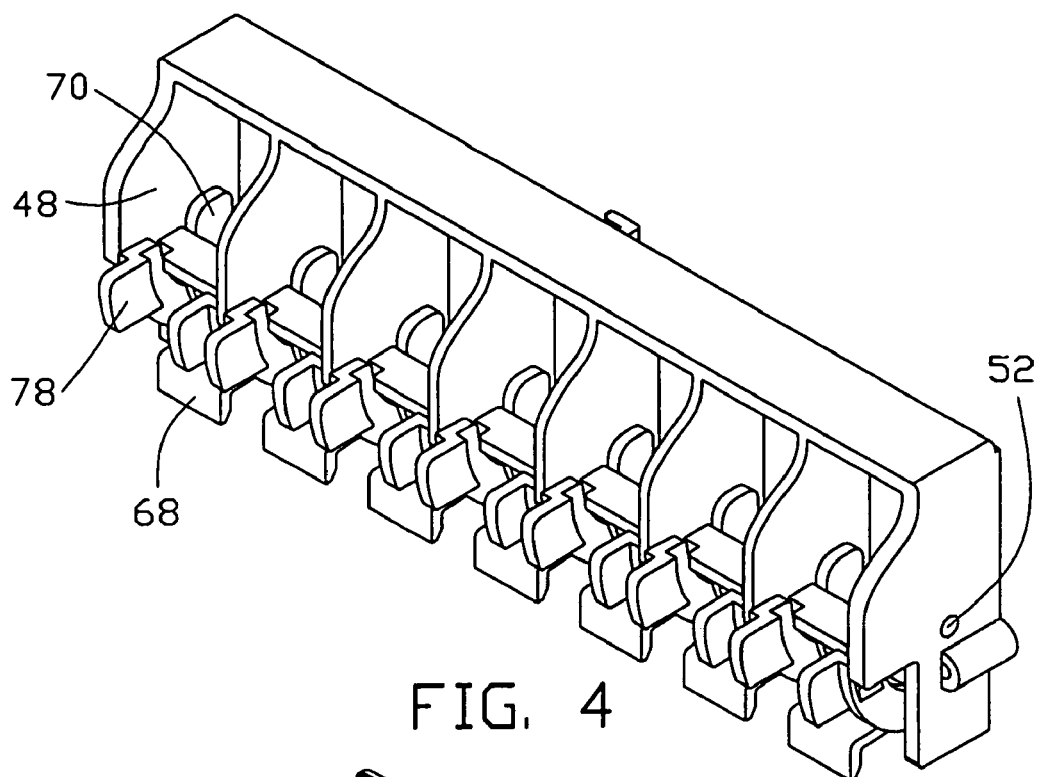
FIG. 4 is an assembled view of FIG. 2.

Referring to FIGS. 2-4, the fixing member 40 comprises a bracket 42 and a plurality of fasteners 62. The bracket 42 comprises a fixing plate 44 and a top plate 46 extending forwardly and perpendicularly to the fixing plate 44. An L-shaped hook 56 is formed at a rear surface of the fixing plate 44 corresponding to the fixing hole 18 of the rear panel 14. A pair of positioning posts 58 protrudes from the rear surface of the fixing plate 22 corresponding to the pair of positioning holes 20. A plurality of L-shaped mounting plates 48 is arranged between the fixing plate 44 and the top plate 46, parallel to each other. Each of the mounting plates 48 comprises a broad plate 49 at an upper portion and a narrow plate (not labeled) at a lower portion. A pivot hole 52 is defined in the broad plate 49 at a rear portion. A bottom portion of each of the broad plates 49 extending outwardly beyond the corresponding narrow plates forms a first securing portion 50. A mounting portion 54 is formed on each of the two outer mounting plates 48, with a locking hole 53 defined therein corresponding to the mounting hole 22 of the rear panel 14.

Each of the fasteners 62 is mounted between every two neighboring mounting plates 48. Each of the fasteners 62 comprises a main body 64, a horizontal pressing portion 66 extending forwardly from a bottom portion of the main body 64, an engaging portion 68 extending downwardly from a distal end of the pressing portion 66, a pair of ear portions 70 extending upwardly from both sides of the main body 64 at a top portion and perpendicularly to the main body 64, and a pair of arc-shaped elastic arm portions 72 extending forwardly and upwardly round the ear portions 70 from both sides of the main body 64. A pivot post 74 protrudes outwardly from each of the ear portions 70 corresponding to the respective pivot hole 52 of the mounting plate 48. A second securing portion 76 is formed on each of the arm portions 72 corresponding to the respective first securing portion 50 of the mounting plate 48. Moreover, an operation portion 78 is formed at a distal end of each of hte arm portions 72 of the fasteners 64. In assembling the fasteners 62 to the bracket 42, the pivot posts 74 of each of the fasteners 62 are received in corresponding pivot holes 52 of the two neighboring mounting plates 48 of the bracket 42. The fasteners 62 are thus pivotably mounted to the bracket 42.

Figure 5:
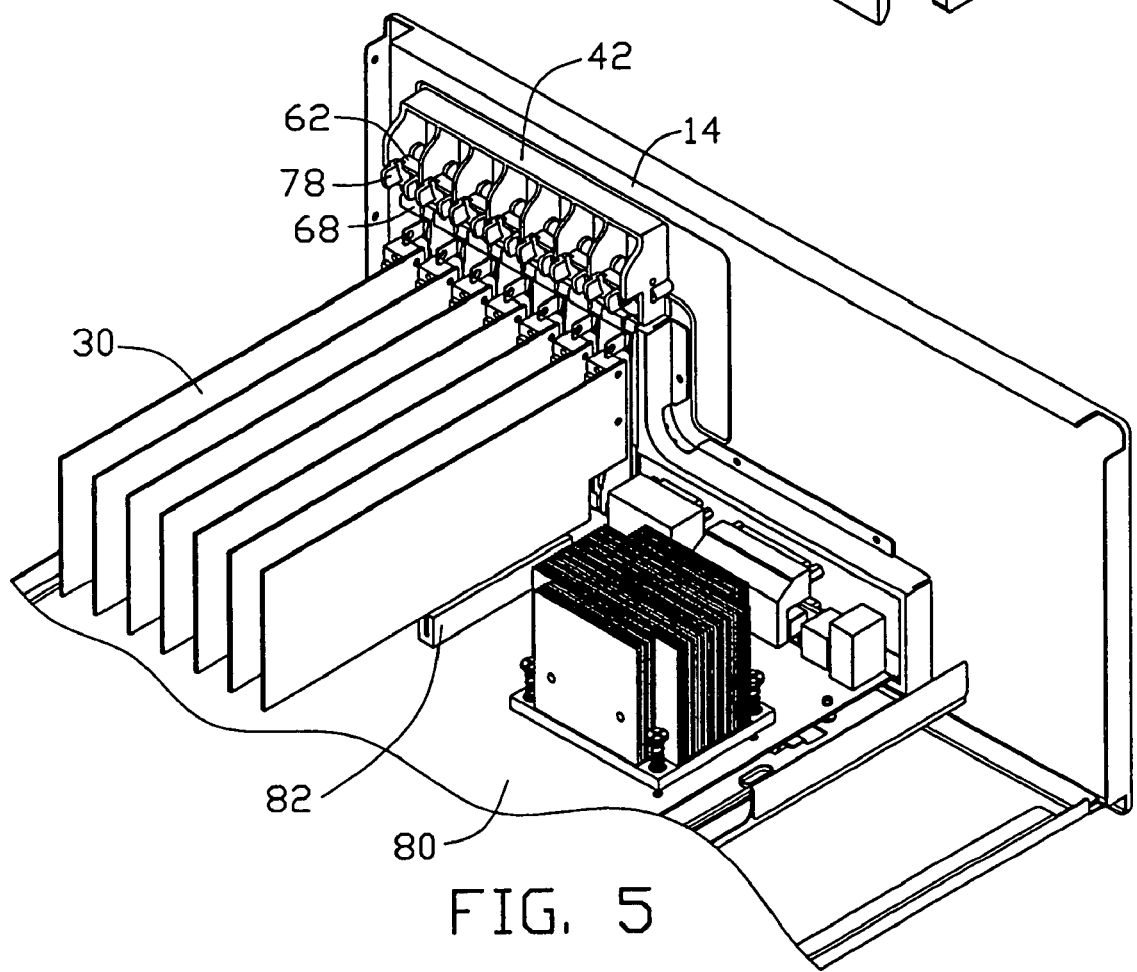
FIG. 5 is an assembled view of FIG. 1.

Referring also to FIGS. 4 and 5, in assembling the combined bracket 42 and fasteners 62 to the rear panel 14 of the chassis 10, the hook 56 is inserted in the fixing hole 18 and hooks the rear panel 14. The positioning posts 58 are received in the positioning holes 20 of the rear panel 14. Each of the mounting holes 22 of the rear panel 14 is in alignment with the corresponding locking hole 53 of the fixing member 40. Fasteners such as rivets (not shown) are inserted through the locking holes 53 and the mounting holes 22 to secure the fixing member 40 to the rear panel 14.

In assembling each of the expansion cards 30 to the chassis 10, the operation portions 78 of the arm portions 72 of each of the fasteners 62 is pressed to deform and rotated upwardly around its pivot posts 74. After the operation portions 78 are released, the second securing portions 76 of the arm portions 72 elastically depend on respective mounting plates 48. Connecting part 32 (see FIG. 1) of each of the expansion cards 30 is inserted into a respective expansion slot 82 (see FIGS. 1 and 5) of the circuit board 80. Then the corresponding cover plate 35 is attached to the slot 29 of the card cage 24. The cutout of the cover plate 35 receives the corresponding positioning post of the card cage 24. Draw the operation portions 78 of the fastener 62 to rotate downwardly, so that the second securing portions 76 thereof are elastically depressed under the first securing portions 50 of the corresponding mounting plates 48. The pressing portion 66 of the fastener 62 presses the bent portion 39 of the cover plate 35. The engaging portion 68 of the fastener 62 presses the elongated portion 37 of the cover plate 35. The expansion card 30 is thus secured to the rear panel 14.

Figure 6:
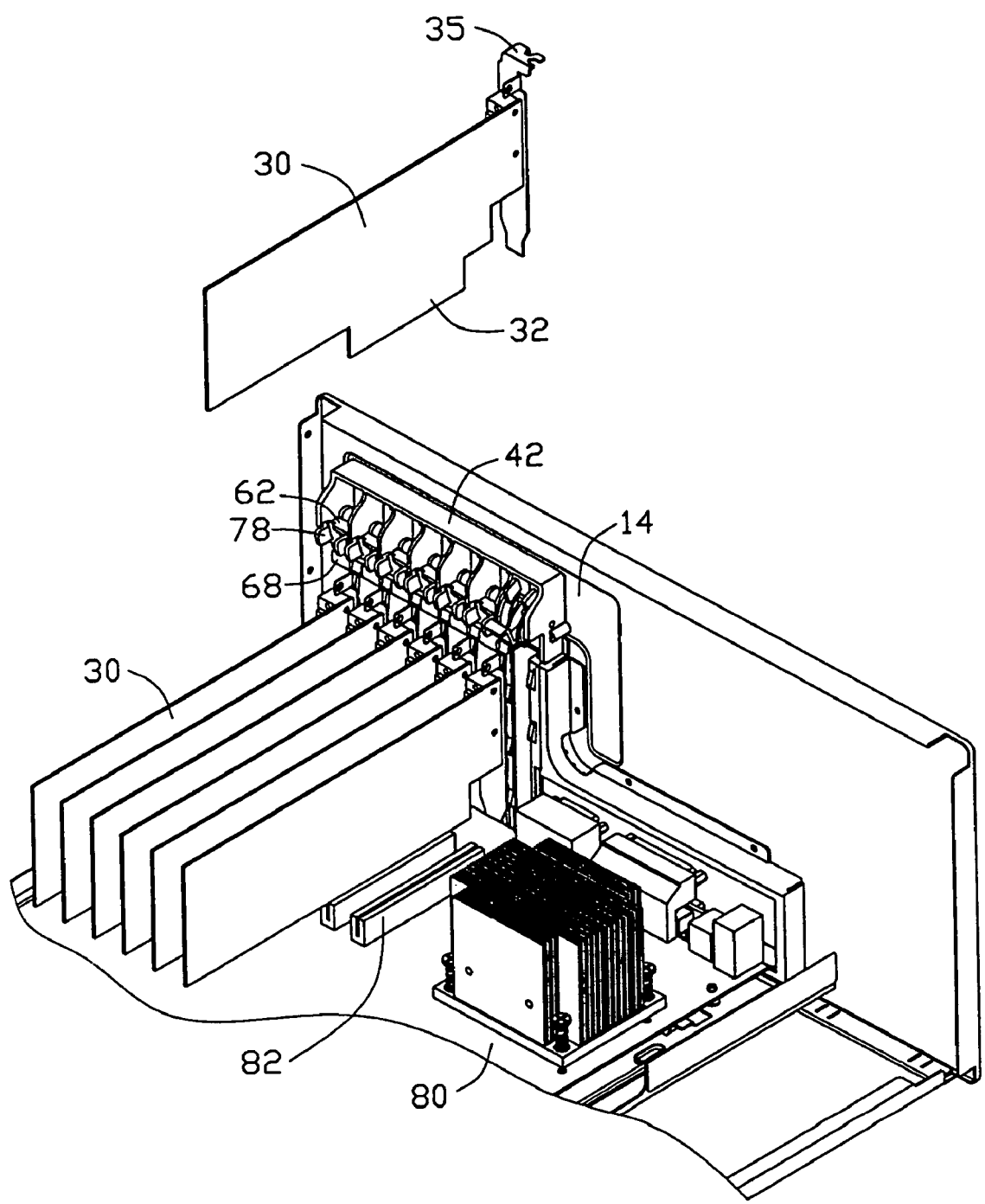
FIG. 6 is similar to FIG. 5, but showing one fastener in an unlocked position and a corresponding expansion card with the corresponding cover plate being separate from the chassis.

Referring to FIG. 6, in disassembly, the operation portions 78 of the fastener 62 are deformed to make the second securing portions 76 thereof release the first securing portions 50 of the mounting plates 48. Rotate the fastener 62 upwardly till the pressing portion 66 of the fastener 62 departs from the bent portion 39 of the cover plate 35 and the engaging portion 68 of the fastener 62 departs from the elongated portion 37 of the cover plate 35. When the operation portions 78 of the fastener 62 are released, the second securing portions 76 thereof elastically depend on respective mounting plates 48. The expansion card 30 can be removed from the rear panel 14.

In addition, the mounting plates 48 can be directly arranged on the rear panel 14. The fasteners 62 without pivot posts 74 can be slidably up and down mounted between every two neighboring mounting plates 48.

It is to be understood, however, that even though numerous characteristics and advantages of the present invention have been set fourth in the foregoing description, together with details of the structure and function of the invention, the disclosure is illustrative only, and changes may be made in detail, especially in matters of shape, size, and arrangement of parts within the principles of the invention to full extent indicated by the broad general meaning of the terms in which the appended claims are expressed.

What is claimed is:

1. A mounting apparatus for mounting at least one expansion card with a cover plate to a computer enclosure, the cover plate having an elongated portion and a bent portion, the mounting apparatus comprising:
   a rear panel having a card cage, the card cage comprising a base wall to support the cover plate, and a bent wall; and
   a fixing member mounted at an upper portion of the rear panel comprising a bracket and at least one fastener movably mounted on the bracket, the bracket forming at least one first securing portion thereof, said fastener comprising a pressing portion corresponding to the bent portion of the cover plate, and at least one arm portion forming a second securing portion corresponding to the first securing portion.

2. The mounting apparatus as described in claim 1, wherein the bracket comprises a fixing plate mounted to the rear panel and a top plate extending forwardly perpendicularly to the fixing plate, a plurality of mounting plates is arranged between the fixing plate and the top plate.

3. The mounting apparatus as described in claim 2, wherein a fixing hole is defined in an upper portion of the rear panel, a pair of positioning holes is defined in the rear panel under the fixing hole, a mounting hole is defined under each of the positioning holes, an L-shaped hook is formed at a rear surface of the fixing plate corresponding to the fixing hole, a pair of positioning posts protrudes from the rear surface of the fixing plate corresponding to the positioning holes, a mounting portion defining a locking hole corresponding to the mounting hole is formed on each of the two outer mounting plates.

4. The mounting apparatus as described in claim 2, wherein there are a plurality of said fasteners, each of the fasteners comprises a main body, said pressing portion extends forwardly from a bottom portion of the main body.

5. The mounting apparatus as described in claim 4, wherein each of the mounting plates comprises a broad plate at an upper portion and a narrow plate at a lower portion, a bottom portion of each of the broad plates extending outwardly beyond the corresponding narrow plate forms the first securing portion.

6. The mounting apparatus as described in claim 5, wherein said arm portion comprises a pair of arc-shaped arm portions extending forwardly and upwardly from both sides of the main body at a bottom portion, the second securing portion protrudes from each of the arm portions.

7. The mounting apparatus as described in claim 6, wherein an operation portion is formed at a distal end of each of the arm portions.

8. The mounting apparatus as described in claim 6, wherein each of the fasteners is pivotably mounted between every two neighboring mounting plates, a pair of ear portions each forming a pivot post thereon extends upwardly from both sides of the main body of each of the fasteners, a pivot hole is defined in the broad plate of each of the mounting plates for pivotably receiving respective pivot post of each of the fasteners.

9. The mounting apparatus as described in claim 6, wherein each of the fasteners is elastically deformed between every two neighboring mounting plates and sliding up and down.

10. A mounting apparatus for mounting at least one expansion card with cover plate to a computer enclosure, the cover plate having an elongated portion and a bent portion, the mounting apparatus comprising:

a rear panel having a card cage, the card cage comprising a base wall to support the cover plate, and a bent wall, at least one first securing portion is arranged on the rear panel; and at least one fastener movably mounted on the rear panel, said fastener comprising a main body, a pressing portion corresponding to the bent portion of the cover plate extending forwardly from the main body, and at least one arm portion extending forwardly and upwardly from the main body, said arm portion forming a second securing portion corresponding to the first securing portion.

11. The mounting apparatus as described in claim 10, wherein a plurality of mounting plates parallel to each other protrudes perpendicularly from the rear panel.

12. The mounting apparatus as described in claim 11, wherein there are a plurality of said fasteners, said pressing portion extends forwardly from a bottom portion of the main body.

13. The mounting apparatus as described in claim 12, wherein each of the mounting plate comprises a broad plate at an upper portion and a narrow plate at a lower portion, a bottom portion of each of the broad plates extending outwardly beyond the corresponding narrow plate forms the first securing portion.

14. The mounting apparatus as described in claim 13, wherein said arm portion comprises a pair of arc-shaped arm portion extends forwardly and upwardly from both sides of the main body at a bottom portion, the second securing portion protrudes from each of the arm portions.

15. The mounting apparatus as described in claim 14, wherein an operation portion is formed at a distal end of each of the arm portion of the fastener.

16. The mounting apparatus as described in claim 14, wherein each of the fasteners is pivotably mounted between every two neighboring mounting plate, a pair of ear portions respectively forming a pivot post thereon extends upwardly from both sides of the main body of each of the fasteners, a pivot hole is defined in the broad plate of each of the mounting plate for pivotably receiving respective pivot post of each of the fasteners.

17. The mounting apparatus as described in claim 14, wherein each of the fasteners is elastically deformed between every two neighboring mounting plate and sliding up and down.

18. A mounting apparatus for mounting at least one expansion card with a cover plate to an enclosure of an electronic device, comprising:

a rear panel of said enclosure having a card cage in said enclosure to supportively mount said cover plate thereto; and at least one fastener, corresponding to said at least one expansion card, movably attached to said rear panel next to said card cage, said at least one fastener comprising a pressing portion approachably extending toward said cover plate and a pair of resiliently juxtaposing arms, said at least one fastener movable between a first position where said cover plate is fixedly sandwiched between said pressing portion and said card cage, and a second position where said pressing portion is removed from said cover plate to release said cover plate, said pair of arms lockable onto said rear panel to fix said at least one fastener in said first position, and resiliently movable to each other to release said at least one fastener and allow movement of said at least one fastener from said first position to said second position.

19. The mounting apparatus as described in claim 18, wherein said at least one fastener is attached to said rear panel via a bracket which is entirely located in said enclosure next to said rear panel, and rotarily movable in said bracket.

20. The mounting apparatus as described in claim 19, wherein a first securing portion is formed on said bracket to allow a second securing portion of each of said pair of arms lockable thereon.

* * * * *